(12) United States Patent
Huang

(10) Patent No.: US 9,275,740 B2
(45) Date of Patent: Mar. 1, 2016

(54) METHOD AND APPARATUS FOR IMPROVING DATA INTEGRITY USING THRESHOLD VOLTAGE RECALIBRATION

(71) Applicant: Yiren Ronnie Huang, San Jose, CA (US)

(72) Inventor: Yiren Ronnie Huang, San Jose, CA (US)

(73) Assignee: CNEXLABS, INC., San Jose, CA (US)

( * ) Notice: Subject to any disclaimer, the term of this patent is extended or adjusted under 35 U.S.C. 154(b) by 0 days.

(21) Appl. No.: 14/451,176

(22) Filed: Aug. 4, 2014

(65) Prior Publication Data

US 2015/0036432 A1 Feb. 5, 2015

Related U.S. Application Data

(60) Provisional application No. 61/862,209, filed on Aug. 5, 2013.

(51) Int. Cl.

| | |
|---|---|
| G11C 16/10 | (2006.01) |
| G11C 16/26 | (2006.01) |
| G06F 11/10 | (2006.01) |
| G11C 11/56 | (2006.01) |
| G11C 16/34 | (2006.01) |
| G11C 7/14 | (2006.01) |
| G11C 29/02 | (2006.01) |

(52) U.S. Cl.
CPC ............ *G11C 16/10* (2013.01); *G06F 11/1048* (2013.01); *G11C 7/14* (2013.01); *G11C 11/5642* (2013.01); *G11C 16/26* (2013.01); *G11C 16/3404* (2013.01); *G11C 29/021* (2013.01); *G11C 29/028* (2013.01)

(58) Field of Classification Search
CPC .............................. G11C 16/10; G11C 16/26
USPC ....................................... 365/185.12, 185.24
See application file for complete search history.

(56) References Cited

U.S. PATENT DOCUMENTS

| 2011/0219274 A1* | 9/2011 | Cho et al. ...................... 714/708 |
| 2013/0031443 A1* | 1/2013 | Oh et al. ........................ 714/773 |
| 2013/0094289 A1* | 4/2013 | Sridharan et al. ......... 365/185.03 |
| 2013/0148437 A1* | 6/2013 | Bronner et al. ........... 365/185.29 |
| 2013/0185609 A1* | 7/2013 | Park et al. ..................... 714/746 |
| 2013/0198577 A1* | 8/2013 | Oh et al. ........................ 714/704 |
| 2014/0119114 A1* | 5/2014 | Motwani .................. 365/185.03 |

* cited by examiner

*Primary Examiner* — Michael Tran

(74) *Attorney, Agent, or Firm* — James M. Wu; JW Law Group

(57) ABSTRACT

A non-volatile ("NV") memory device is able to enhance data integrity using threshold voltage ("Vt") recalibration based on a selected scheme. Upon receiving a command for reading a data page, the process, in one embodiment, identifies a reference page which is located at a predefined location in a block of the NV memory. After reading the first reference data from the reference page by a reader in response to a first or current Vt, a first bit error rate ("BER") is generated based on the comparison between the first reference data and the predefined known data pattern. If the first BER is greater than a predefined BER target, a second Vt is subsequently calculated in accordance with the first Vt. When the second BER is equal to or less than the predefined BER target, an optimal Vt is set to the second Vt. There are also two other methods using DC balance coding scheme and counting the number of 1's in the selected data page can be used in recalibrating the threshold voltage.

18 Claims, 12 Drawing Sheets

METHOD AND APPARATUS FOR IMPROVING DATA INTEGRITY USING THRESHOLD VOLTAGE RECALIBRATION

PRIORITY

This application claims the benefit of priority based upon U.S. Provisional Patent Application Ser. No. 61/862,209, filed on Aug. 5, 2013 in the name of the same inventor(s) and having a title of "Method and Apparatus for Calibrating Threshold Voltage of Flash Memory Using Data Pattern," hereby incorporated into the present application by reference.

FIELD

The exemplary embodiment(s) of the present invention relates to computer storage systems. More specifically, the exemplary embodiment(s) of the present invention relates to memory access to non-volatile ("NV") memory devices.

BACKGROUND

With increasing popularity of electronic devices, such as computers, smart phones, mobile devices, server farms, mainframe computers, and the like, the demand for more and faster data is constantly growing. To handle and facilitate voluminous data between such electronic devices, high speed NV memory devices are typically used. A conventional type of NV memory device, for example, includes flash memory.

The flash memory, in one example, is an electronic NV computer storage device capable of maintaining, erasing, and/or reprogramming data. The flash memory can be fabricated with several different types of integrated circuit ("IC") technologies such as NOR or NAND logic gates with, for example, floating-gate transistors. Depending on the applications, a typical memory access of flash memory can be configured to be a block, a page, a word, and/or a byte.

The structures and/or characteristics of flash memory cell exhibit characteristics similar to those of volatile memory circuitry. In flash memory, each memory cell, for example, resembles basic structure of a standard MOSFET, except that the flash memory cell contains at least one floating gate ("FG") transistor which has two gates instead of one gate. On top of FG transistor is a control gate ("CG") wherein below the CG, an FG is situated. An FG is typically insulated by one or more oxide or insulating layers, and is interposed between the CG and the MOSFET channel. Since the FG is electrically isolated by its insulating layer, any electrons that are trapped inside of the FG may last for a long period of time without substantially discharging.

When an FG holds a charge, it screens or partially cancels electric field generated by the CG. The CG is used to apply the threshold voltage ("Vt") to the cell for memory access. Note that higher voltage is typically required at the CG to conduct the channel. During a read-out operation, a voltage such as Vt is applied to the CG to make the channel to be conductive. Upon sensing a current flowing through a MOSFET channel, a binary code or value can be read and a corresponding stored data is reproduced. In a multi-level cell device which stores more than one bit per cell, the amount of current flow is sensed in order to determine a level of charge which corresponds to a binary value stored in the FG.

A drawback, however, associated with a typical flash memory device is loss of charge prematurely due to certain environmental conditions, such as read disturb, read error, aging, inter-cell interference, and the like. If the storage controller fails to intervene in time, the loss of charge in the FG can lead to data loss and/or unusable or unrecoverable error-prone data. The read disturb, for example, may occur when a neighboring cell has been accessed. Reading NAND based flash memory, for instance, can cause nearby cells in the same memory block to dissipate their charges prematurely. To reduce premature loss of charge, a conventional approach is to refresh stored data based on certain conditions such as number of read times.

SUMMARY

A non-volatile ("NV") memory device is able to enhance data integrity using threshold voltage ("Vt") recalibration based on a selected Vt adjustment scheme. Upon receiving a data access command such as a read command, a process, in one embodiment, identifies a reference page which is located at a predefined location in a block of the NV memory. After reading the first reference data from the reference page by a reader in response to a first or current Vt, a first bit error rate ("BER") is generated based on the comparison between the first reference data and the predefined known data pattern. If the first BER is greater than a predefined BER target, a second Vt is subsequently applied in accordance with the first Vt. When the second BER is equal to or less than the predefined BER target, an optimal Vt is set to the second Vt.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
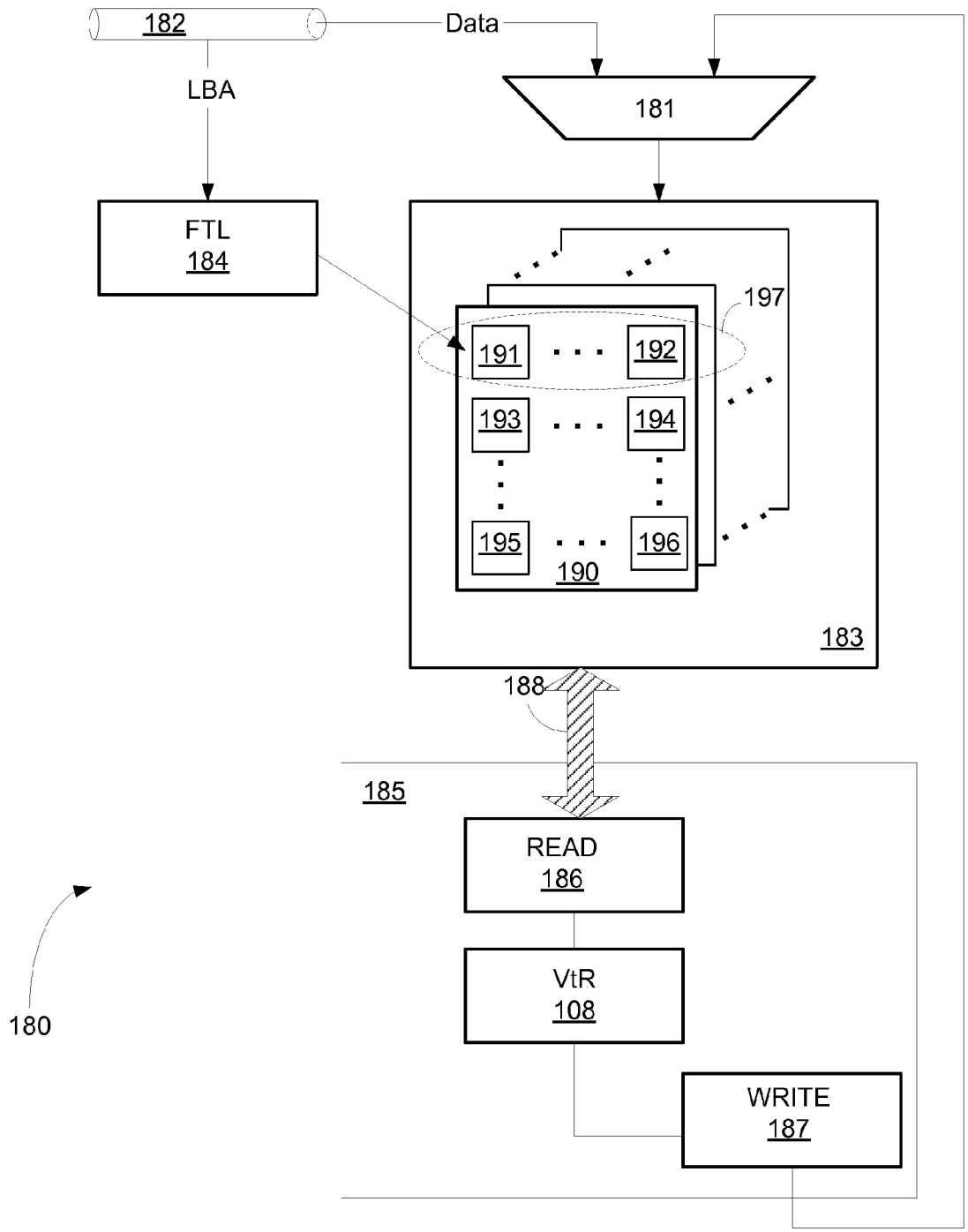
FIG. 1 is a block diagram illustrating a non-volatile ("NV") memory device capable of recalibrating threshold voltage ("Vt") for memory access in accordance with one embodiment of the present invention.

Embodiments of the present invention are described herein with context of a method and/or apparatus for enhancing data integrity in non-volatile ("NV") storage device using a process of recalibrating threshold voltage ("Vt").

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. In addition, those of ordinary skills in the art will recognize that devices of a less general purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, sub-systems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the present invention discloses a storage device such as an SSD using various NV memory cells for data storage. To increase storage capacity, a Vt calibrator or recalibrator ("VtR") is employed to recalibrate Vt based on an earlier stored reference page. Upon receiving a command for reading a data page of the NV memory, the process of VtR identifies the reference page which is located at a predefined location in a block of the NV memory. After reading the first reference data from the reference page by the reader or reading circuitry in response to a first Vt, a first bit error rate ("BER") is generated based on the comparison between the first reference data and the predefined known data pattern. A second Vt is subsequently calculated in accordance with the first Vt if the first BER is greater than a predefined BER target. In an alternative embodiment, an optimal Vt is set to the second Vt when the second BER is equal to or less than the predefined BER target.

Alternatively, after receiving an access request to an NV memory cell, a method of VtR capable of modifying Vt is able to identify a data page in a block or flash memory block ("FMB"). Upon reading a first predefined set of data from the data page by the reader in response to a first Vt, a first BER is generated based on a predefined direct-current ("DC") balance coding scheme. If the first BER is greater than a predefined BER target, a second Vt is calculated in accordance with the first Vt. If the second BER is equal to or less than the predefined BER target, an optimal Vt is set to the second Vt.

In another embodiment, after identifying a data page in a block of an NV memory for memory access, the first data is read from the data page by the reader in response to a first Vt. The first data can be a portion of the data stored in the data page. The number of one's (1's) within the first data is subsequently counted. A counting metadata associated with the data page is fetched from the block. The counting metadata identifies an original count of number of 1's in the first data. A first BER is generated based on comparison between the number of 1's in the first data and the original count. A second Vt is calculated in accordance with the first Vt if the first BER is greater than a predefined BER target. If the second BER is equal to or less than the predefined BER target, an optimal Vt is set to the second Vt.

FIG. 1 is a block diagram 180 illustrating a NV memory device capable of recalibrating Vt for memory access in accordance with one embodiment of the present invention. Diagram 180 includes input data 182, storage device 183, output data 188, and storage controller 185. Storage controller 185 further includes read module 186, VtR 108, and write module 187. Diagram 180 also includes a flash translation layer ("FTL") 184 which can be part of storage controller 185. FTL 184, for example, maps logic block addresses ("LBAs") to physical addresses. It should be noted that the underlying concept of the exemplary embodiment(s) of the present invention would not change if one or more blocks (or devices) were added to or removed from diagram 180.

A flash memory based storage device such as SSD, for example, includes multiple arrays of flash memory cells for data storage. The flash memory, which generally has a read latency less than 100 microseconds ("µs"), is organized in blocks and pages wherein a minimum access unit may be set to four (4) kilobyte ("Kbyte"), eight (8) Kbyte, or sixteen (16) Kbyte memory capacity depending on the flash memory technologies. Other types of NV memory, such as phase change memory ("PCM"), magnetic RAM ("MRAM"), STT-MRAM, or ReRAM, can also be used in storage device 183. To simplify the forgoing discussion, the flash memory or flash memory based SSD is herein used as an exemplary NV storage device.

The SSD includes multiple non-volatile memories or FMBs 190, FTL 184, and storage controller 185. Each of FMBs 190 further includes a set of pages 191-196 wherein each page such as page 191 has a block size of 4096 bytes or 4 Kbyte. In one example, FMBs 190 can contain from 128 to 512 pages or sectors or blocks 191-196. A page or block is generally a minimal writable unit. It should be noted that the terms "block", "page", "chunk", and "sector" can be herein used interchangeably. Flash memory 183 is able to persistently retain information or data for a long period of time without power supply.

To improve data integrity, a VtR 108 is employed to reduce data errors that could occur due to unintended scenarios, such as, but not limited to, read disturb, data retention, inter-cell interference, aging factor, and the like. In one embodiment, VtR 108 is able to adjust Vt to compensate certain unintended scenarios such as read disturb and/or aging factor. For example, VtR 108 is able to modify Vt according to an earlier stored reference page which contains a known pattern.

An advantage of employing VtR 108 is that it is able to improve data integrity by identifying an optimal Vt to compensate the loss of charge.

Figure 2A:
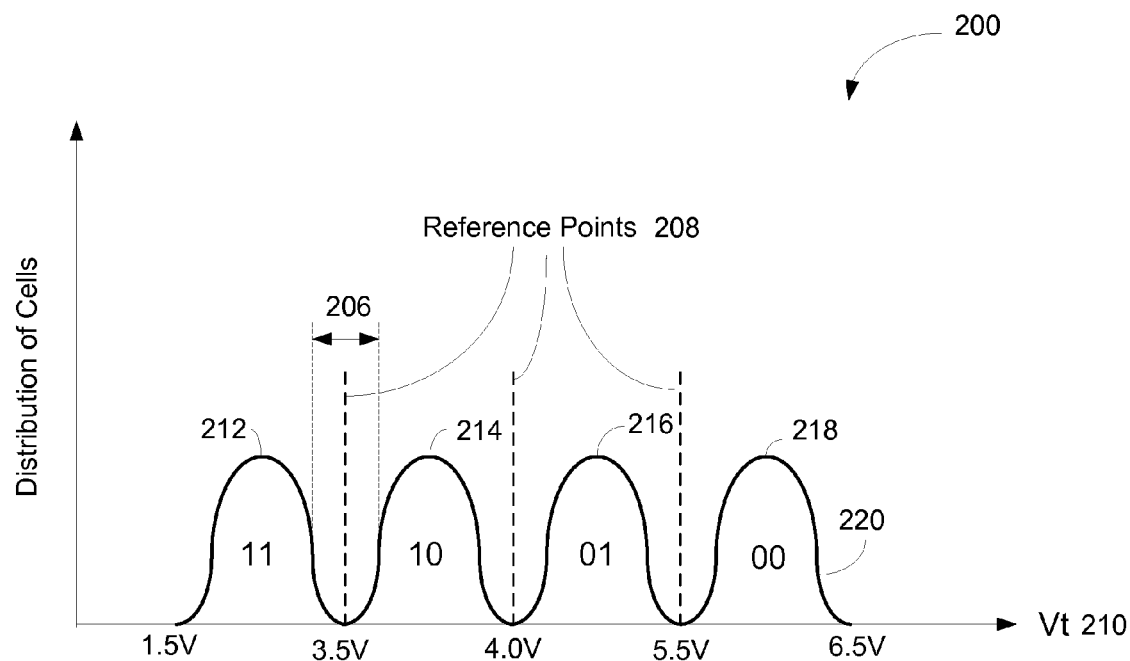
FIGS. 2A-D are diagrams illustrating threshold voltage levels for a multiple level cell ("MLC") in a storage device in accordance with one embodiment of the present invention.

FIG. 2A is a diagram 200 illustrating a voltage distribution showing multiple Vt levels in a multiple level cell ("MLC") of an NV memory in accordance with one embodiment of the present invention. Diagram 200 illustrates a voltage distribution chart showing 2-bit information in MLC. For example, four (4) regions 212-218 represent binary numbers 11, 10, 01, and 00 respectively, in actual flash memory design the different levels can also be coded differently such as using Gray code, for example, 11, 10, 00, 01. Regions 212-218 are logically separated by reference points 208. It should be noted that the underlying concept of the exemplary embodiment(s) of the present invention would not change if one or more regions (or levels) were added to or removed from diagram 200.

Diagram 200, in one embodiment, shows a normal condition illustrating a 2-bit voltage distribution once data is stored or written. Region 212, for instance, covers an area from 1.5 volts ("V") to 3.5 V and region 214 which represents binary number 10 covers an area from 3.5 V to 4.0 V. Vt range 206 is used to separate region 212 from region 214. While region 216 covers area from 4.0 V to 5.5 V, region 218 covers area from 5.5 V to 6.5 V. To correctly obtain or read the binary data, the accurate Vt which separates between binary values is important. When the data is written, an original voltage distribution curve 220 representing binary information is shown in diagram 200. However, curve 220 may shift overtime due to various reasons, such as aging factor, inter-cell interference, read disturb, and the like.

Figure 2B:
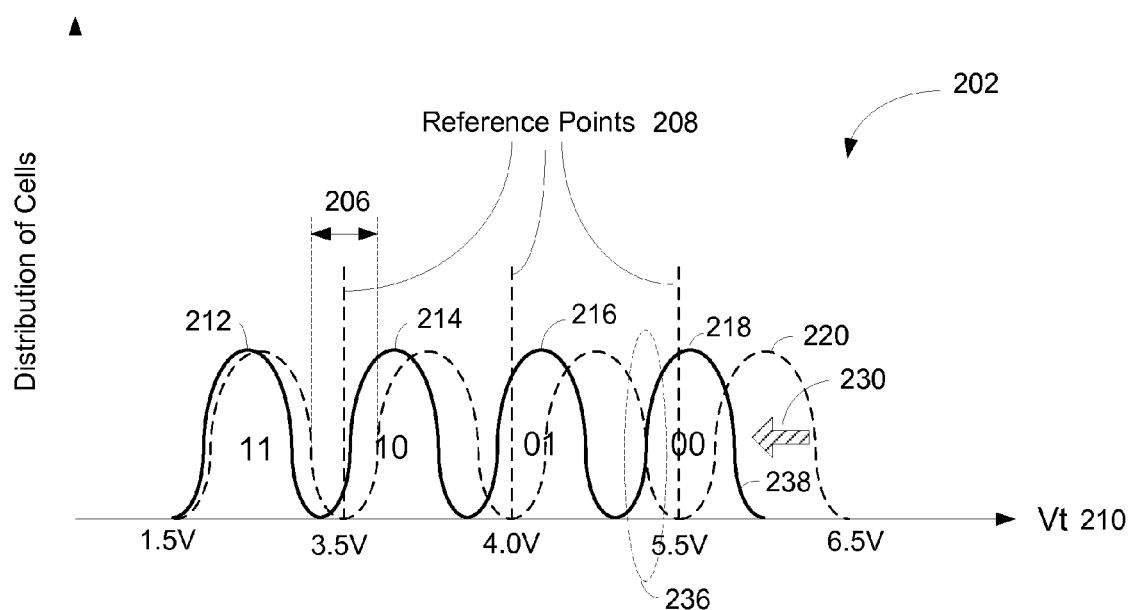

FIG. 2B is a diagram 202 illustrating a shift or a change in position relating to voltage curve representing binary information in accordance with one embodiment of the present invention. Diagram 202 shows a curve shift indicated by arrow 230 from original curve 220 to current curve 238 due to loss of charge or electron discharging in FG. When curve 220 begins to shift, error may be introduced if the reader or sensing circuitry reads the data based on original Vt. For example, when curve is shifted as indicated by arrow 230, data error, for example, may occur at area 236 because area 236 overlaps region 216 of original curve 220 with region 218 of current curve 238. Depending on the readers, area 236 may be read either as 00 or 01 if the original Vt is used.

A reason to cause the loss of charge is that electrons stored in the FG of a cell have leaked or dissipated over time. Note that the floating gate leakage can occur naturally. Depending on flash memory fabrication technologies, the leakage of electrons from FG may vary. Other surrounding factors, such as number of program or erase, aging, read disturb, inter-cell interference, and the like, can also aggravate electrons discharge from the FG.

Figure 2C:
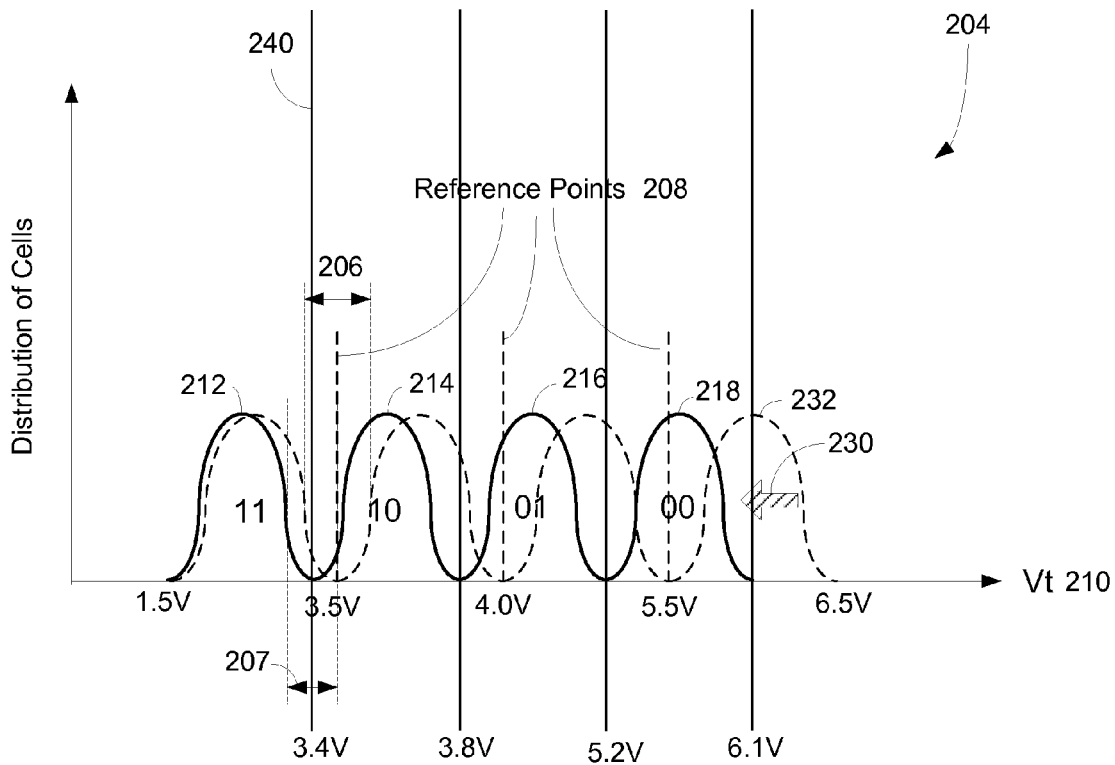

FIG. 2C is a diagram 204 illustrating threshold voltage levels for MLC in a flash memory device in accordance with one embodiment of the present invention. Diagram 204 illustrates a process of shifting reference point or Vt from original reference point 208 to new reference point 240 to compensate the curve shift as indicated by arrow 230. For example, after shifting, new region for binary value 11 covers an area from 1.5 V to 3.4 V and new region for binary value 10 covers an area from 3.4 V to 3.8 V. While new region for binary value 01 covers an area from 3.8 V to 5.2 V, region for binary value 00 covers an area from 5.2 V to 6.1 V.

VtR, in one embodiment, is able to recalibrate Vt or a range of Vt to compensate the curve shifting. It should be noted that the flash memory cells can have multiple levels, such as SLC (Single Level Cell), MLC (Multiple Level Cell normally it means 2 bits/cell), TLC (Tri-Level Cell, which is 3 bits/cell), and the like. To identify an optimal or workable Vt before data retrieving, VtR, for example, uses a reference page located within the block at a predefined fixed location to adjust Vt. The reference page, for example, can contain a previously known pattern such as a checkerboard pattern. The checkerboard pattern includes approximately equal number of 1's and 0's wherein 1's and 0's are written in an alternating manner. An optimal Vt is identified or found when the reference page is obtained with minimal or targeted bit error rate ("BER").

Alternatively, VtR can also use a DC balance scheme to identify an optimal Vt for the current read or subsequent read. The DC balance scheme or coding such as 8 bit/10 bit is able to balance the data perfectly or near perfectly. During a reading or retrieving operation, Vt is recalibrated or adjusted based on repeated readings and verifying the retrieved data according to DC balancing criteria. It should be noted that multiple iterations may be needed to identify an optimal Vt. It should be noted that optimal Vt indicates the best Vt with acceptable BER under the current condition.

VtR, in one embodiment, can also use a counting method to modify Vt for current read. The counting method counts number of 1's over 0s, and stores the counted value or counter together with the data. During a read operation, if the number of 1's in the data page is different from the stored counted value, Vt is recalibrated. The data page is read again using the recalibrated Vt. The process of reading, counting, and recalibrating repeats until a match or an almost match is found between the number of 1's in the data page and the stored counted value. Depending on the applications, flip bit(s), in one example, may be used to flip data bits for DC balance.

It should be noted that a flash memory cell can store one (1), two (2), three (3), or more bits per cell and the different threshold voltages are used to separate the cell levels. By adjusting the voltage level(s) when reading the cell, an optimal Vt can be identified when minimal BER is reached. To compensate FG electron leakage, Vt adjustment can be used to produce more accurate data read.

Figure 2D:
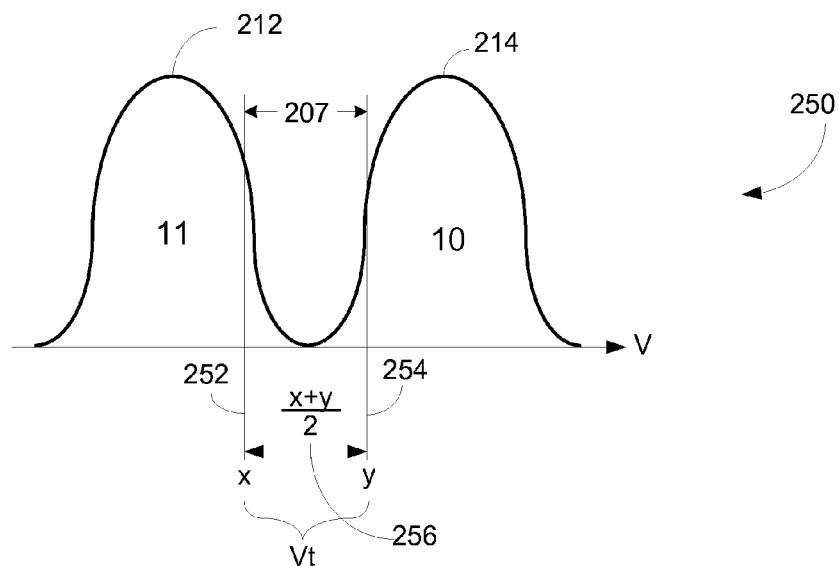

FIG. 2D is a diagram 250 illustrating a Vt range 207 used to differentiate voltage regions for MLC in accordance with one embodiment of the present invention. To recalibrate or adjust Vt, a binary search method, in one embodiment, is used. Diagram 250 illustrates a process of adjusting Vt reference points using the binary search method. The binary search method, in one example, sets x to the beginning point 252 of range 207 and sets y to the ending point 254 of range 207. The binary search mechanism is first to identify a first midpoint (x+y)/2 as indicated by numeral 256. VtR is able to repeat x setting and y setting until an optimal Vt or the best Vt is determined.

Figure 3:
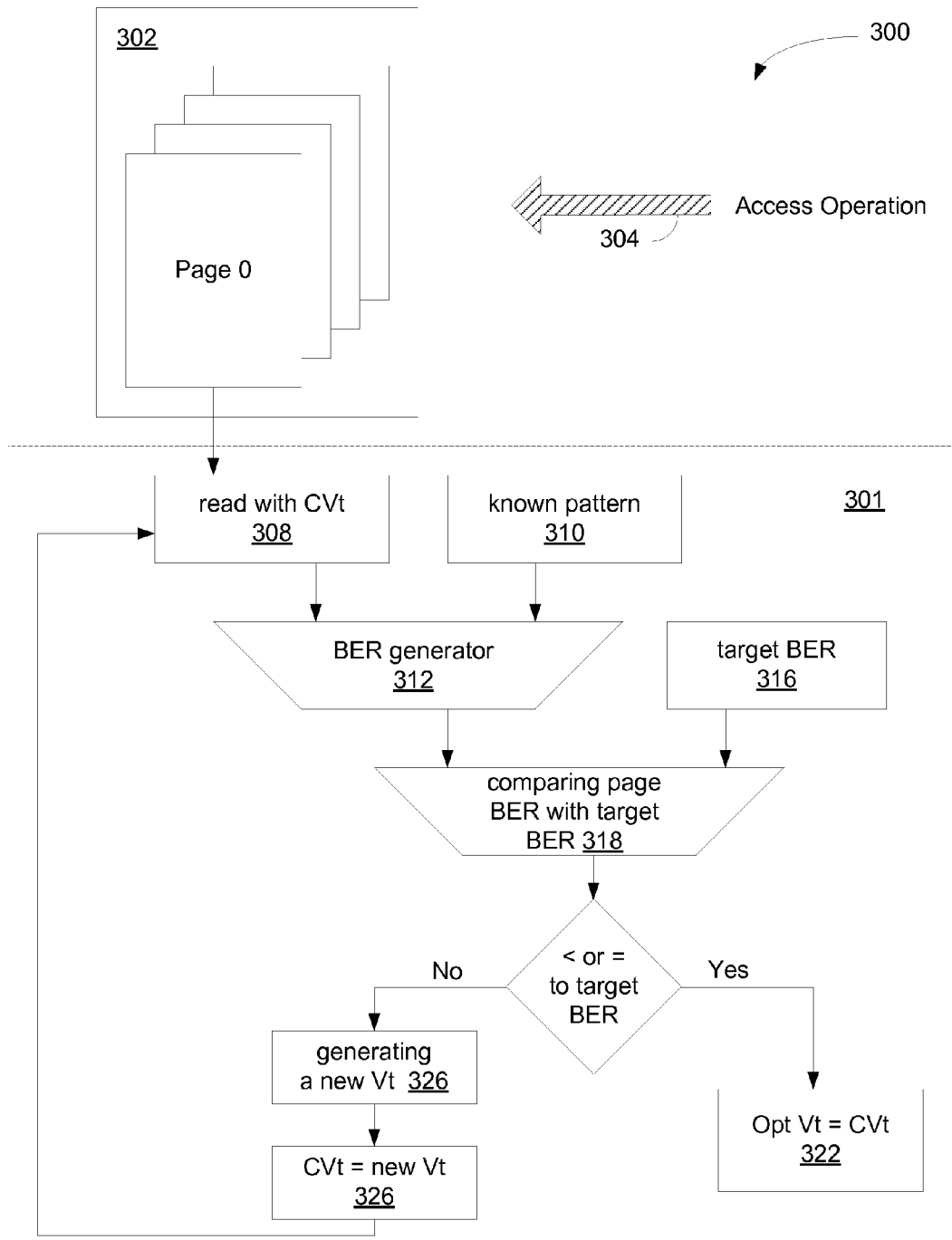
FIG. 3 is a logic diagram illustrating a process of identifying an optimal Vt using a reference page in accordance with one embodiment of the present invention.

FIG. 3 is a logic diagram 300 illustrating a process of identifying an optimal Vt using a reference page in accordance with one embodiment of the present invention. Diagram 300 includes a storage device 302 and a storage controller 301 wherein storage device 302 may be an input/output ("I/O") based storage device capable of persistently storing data. In one aspect, storage device 302 includes arrays of flash memory cells and is organized in flash memory blocks ("FMBs"). Each FMB, in one example, is further configured into multiple pages. It should be noted that the underlying concept of the exemplary embodiment(s) of the present invention would not change if one or more blocks (or devices) were added to or removed from diagram 300.

Storage controller 301, which is capable of performing Vt recalibration function, includes a reader or data sensing circuit 308, a known pattern 310, and a target BER 316. Storage controller 301 is able to find an optimal Vt by recalibrating current Vt ("CVt") based on a reference page. The reference page, in one embodiment, stores a checkerboard pattern which stores 1's and 0's in an alternating manner until the entire page is filled. The reference page, in one aspect, is stored every time the FMB is written. A predefined location such as page 0 or page 256 within each FMB, for example, is a designated location for storing the reference page.

During an operation, upon receipt of a memory access command 304 such as a read instruction, a reference page located at a predefined fixed location such as page 0 is identified in the block or FMB of NV memory. After reading the reference data from the reference page by the reader in response to current Vt ("CVt") at step 308, a BER at step 312 is generated based on the comparison between the reference data and a predefined known data pattern 310 such as the checkerboard pattern. After comparing the BER with a target BER at step 318, a new Vt may be calculated at step 326 if the BER is greater than target BER 316. After setting CVt to the new Vt at step 326, the process loops back to step 308 to repeat the procedure until an optimal Vt is identified. When the BER is smaller than or equal to the target BER at step 318, the optimal Vt is set to CVt at step 322 which indicates that the optimal Vt is found.

Figure 4:
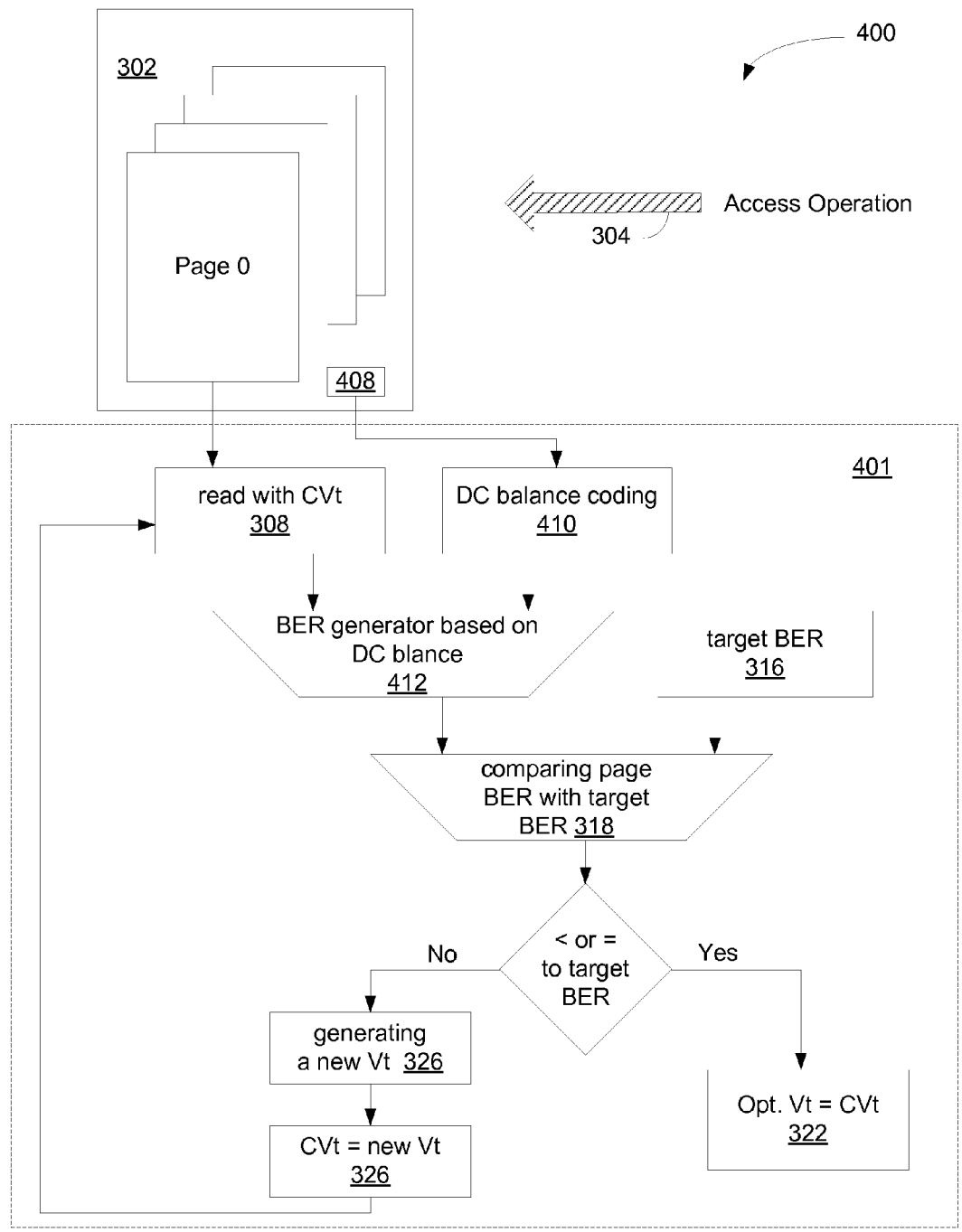
FIG. 4 is a logic diagram illustrating a process of identifying an optimal Vt using a DC balance approach in accordance with one embodiment of the present invention.

FIG. 4 is a logic diagram 400 illustrating a process of identifying an optimal Vt using a DC balanced approach in accordance with one embodiment of the present invention. Diagram 400 is similar to diagram 300 except that DC balance is used instead of the reference page. Diagram 400 includes a storage device 302 and a storage controller 401 wherein storage device 302 may be an I/O based storage device capable of persistently storing data. It should be noted that the underlying concept of the exemplary embodiment(s) of the present invention would not change if one or more blocks (or devices) were added to or removed from diagram 400.

During an operation, a process is able to identify a data page in a block or FMB of an NV memory after receiving a command 304 to read the FMB. After reading a first predefined set of data from the data page by the reader at block 308 using a first Vt or CVt, a first BER is generated at step 412 based on a predefined DC balance coding scheme 410. If the first BER, at step 318, is greater than predefined target BER 316, a second Vt or new Vt is calculated at step 326 in accordance with the CVt. After reading a second predefined set of data from the data page by the reader at step 308 using the second Vt or new Vt, a second BER is generated based on the predefined DC balance coding scheme. It should be noted that the first predefined set of data and the second predefined set of data are obtained or read from the same data page with different threshold voltages. A third Vt may be subsequently calculated in accordance with the second Vt if the second BER is still greater than the predefined target BER at step 318. When the second BER, however, is equal to or less than the predefined target BER at step 318, the CVt is set to the optimal Vt at step 322 indicating that the optimal Vt is found.

It should be noted that the predefined set of data can be a portion of page, a page, and/or a block depending on the applications. In one embodiment, the process is able to count one's (1's) and zero's (0's) in the first predefined set of data formatted in an eight (8) bits/ten (10) bits DC balance coding scheme. Note that other types of DC balance scheme such as using flip bit or bits to invert zero's and one's to force DC balance.

Figure 5:
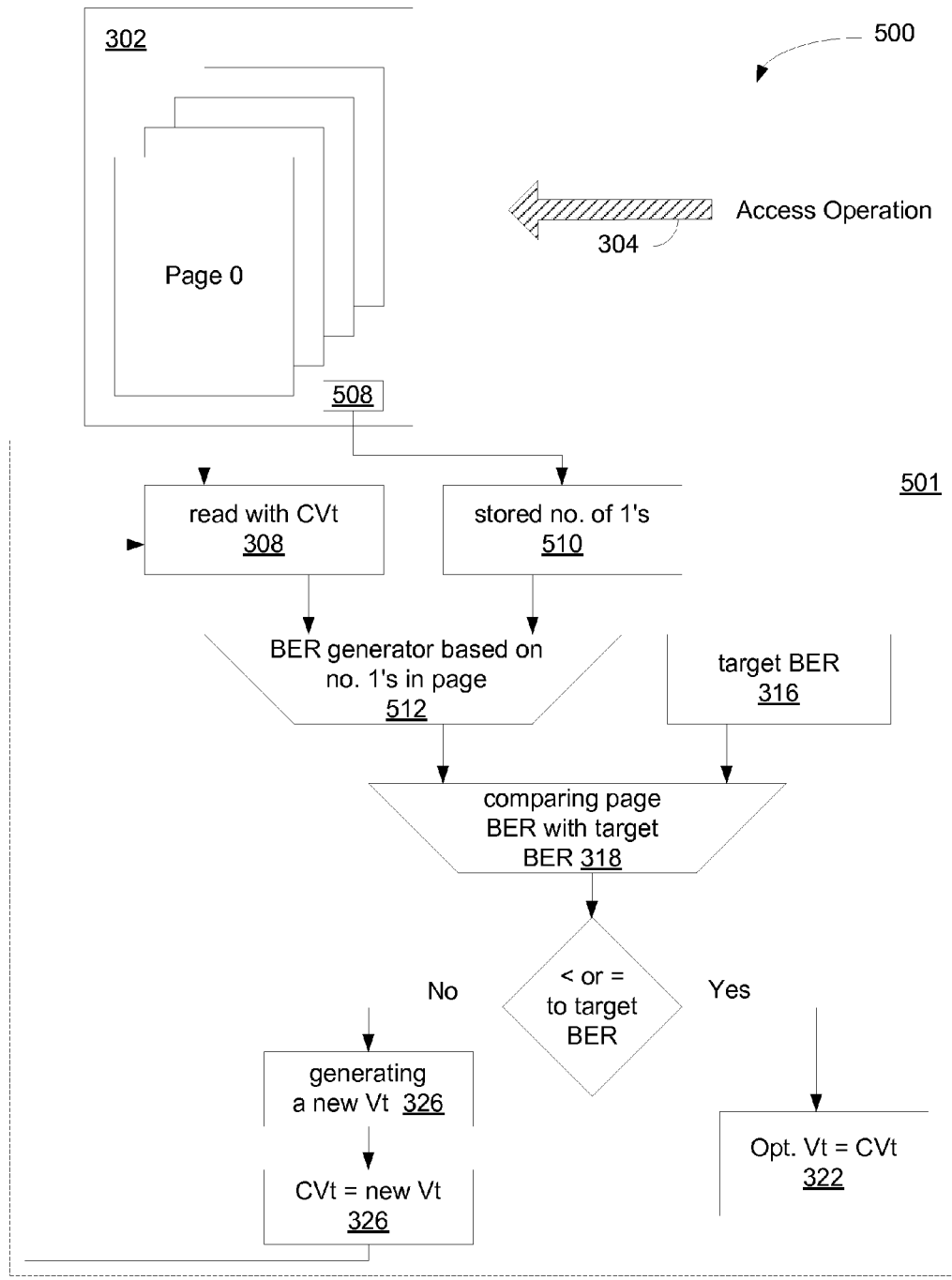
FIG. 5 is a logic diagram illustrating a process of identifying an optimal Vt using a counter capable of counting the number of 1's and/or 0's in accordance with one embodiment of the present invention.

FIG. 5 is a logic diagram 500 illustrating a process of identifying an optimal Vt using a counter capable of counting the number of 1's in accordance with one embodiment of the present invention. Diagram 500 is similar to diagram 300 except that a counter is used instead of the reference page. Diagram 500 includes a storage device 302 and a storage controller 501 wherein storage device 302 may be an I/O based storage device capable of persistently storing data. It should be noted that the underlying concept of the exemplary embodiment(s) of the present invention would not change if one or more blocks (or devices) were added to or removed from diagram 500.

During an operation, a process capable of optimizing Vt identifies a data page in a block or FMB of an NV memory after receiving a command 304 for memory read. After reading a first data from the data page by the reader at step 308 in response to a first Vt or CVt, the number of one's (1's) within the first data is counted. After fetching a counting metadata 508 associated with the data page from the FMB at step 510, the original count from the counting metadata is identified. After generating a first BER at step 512 based on the comparison between the number of 1's in the first data and the original count, a second Vt or new Vt is calculated at step 326 in accordance with the first Vt if the first BER is greater than a predefined BER target. Upon reading a second data from the data page in response to the second Vt or CVt, the number of one's (1's) within the second data is counted. After generating a second BER based on comparison between the number of 1's in the second data and the original count, a third Vt or new Vt may be calculated in accordance with the second Vt if the second BER is still greater than the predefined BER target. If, however, the second BER is equal to or less than the predefined BER target 316, the optimal Vt is set to CVt or the second Vt.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 6:
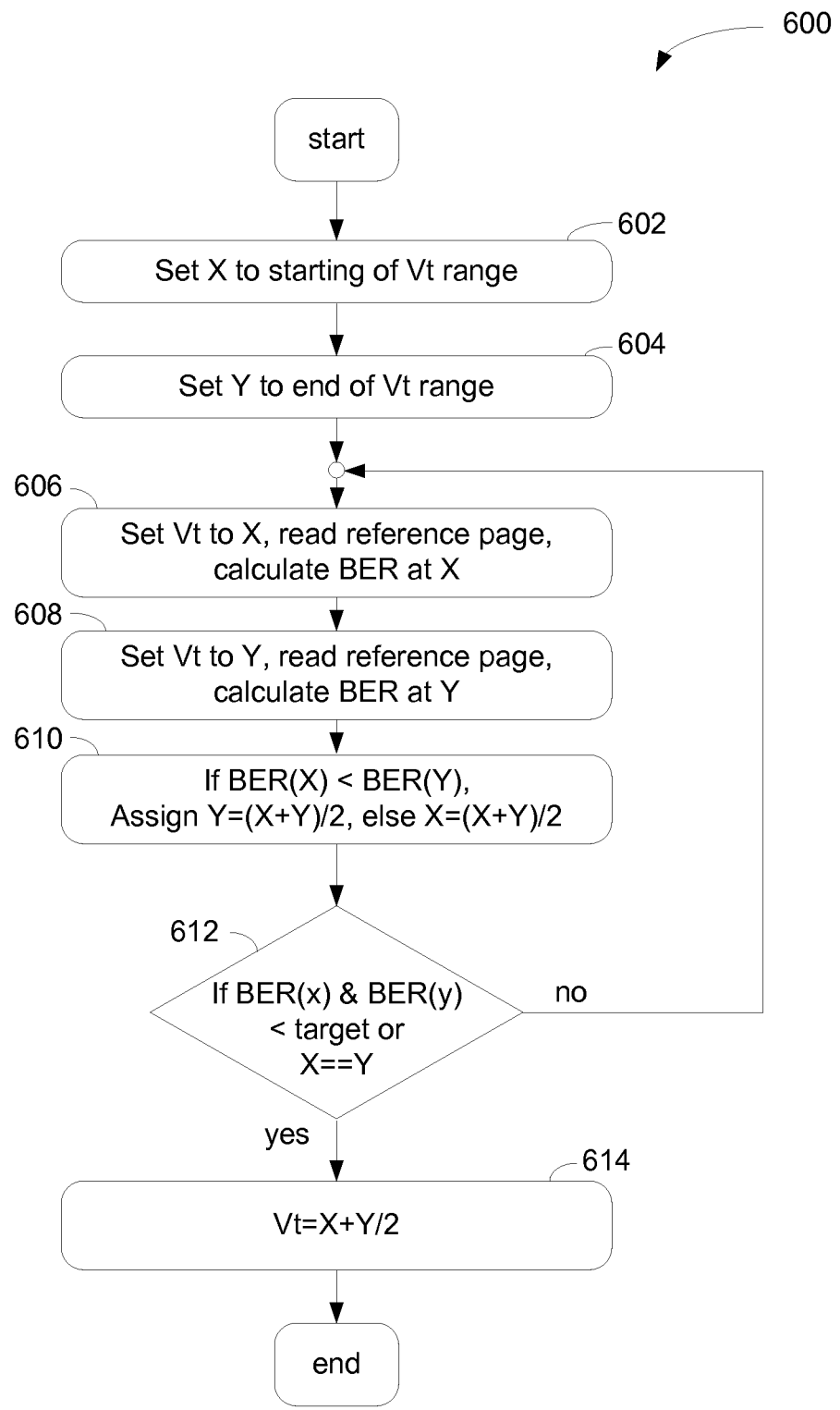
FIG. 6 is a flowchart illustrating a process of identifying an optimal Vt using a reference page in accordance with one embodiment of the present invention.

FIG. 6 is a flowchart 600 illustrating a process of using a reference page to identify an optimal threshold voltage in accordance with one embodiment of the present invention. In order to adjust the threshold value to an optimum value, a reference page is programmed with a known pattern such as a checkerboard pattern. In one example, the checkerboard pattern consists of 1's and 0's that are written in alternate storage space or cell. When memory cell leakage occurs overtime, the reference page and data page should experience similar rate of leakage. As such, if adjusted Vt is sufficient to read the reference data, it should also be sufficient to read the data from the other pages.

At step 602, X is set to the starting of Vt range, and Y, at step 604, is set to the end of Vt range. After setting Vt to X, the reference page is first read. After recording a BER of the reference page using X as Vt ("BER(x)") at step 606, the Vt is now adjusted and the flash memory is read. Upon calculating a BER of the reference page using Y as Vt ("BER(y)") at step 608, BER(x) and BER(y) are compared at step 610. If BER(x) and BER(y) are less than the target BER or x equals to y, Vt or optimal Vt is set to or equal to X+Y/2 at step 614. If, however, If BER(x) and BER(y) are higher than the target BER or x does not equal to y, the process proceeds to step 606 where step 606-610 are repeated until a minimum BER is found. After recording the optimal Vt, the optimal Vt is subsequently used to access the rest of data pages in FMB.

Figure 7:
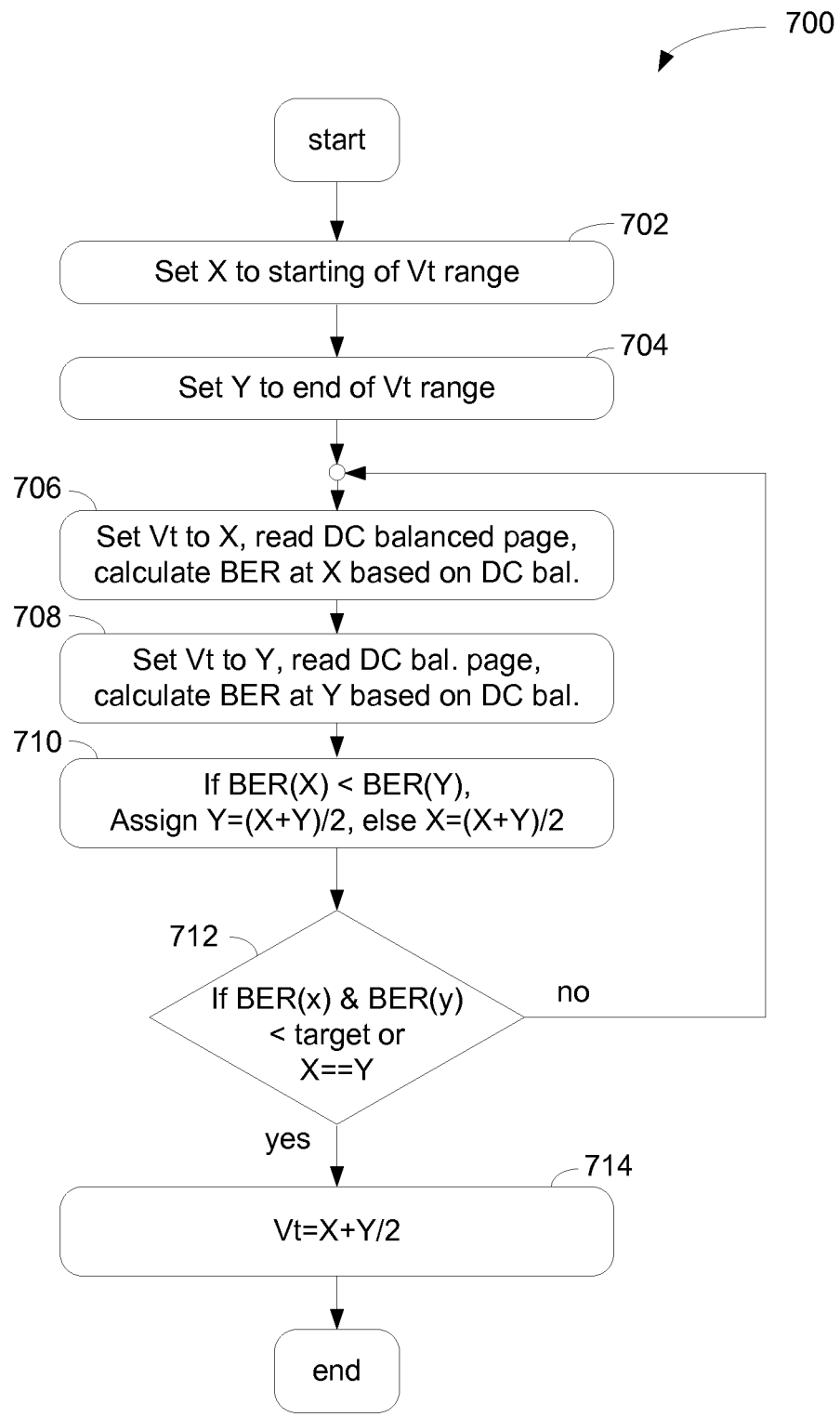
FIG. 7 is a flowchart illustrating a process of identifying an optimal Vt using a DC balance approach in accordance with one embodiment of the present invention.

FIG. 7 is a flowchart 700 illustrating a process of identifying an optimal Vt using a DC balance approach in accordance with one embodiment of the present invention. In one embodiment, a DC balanced coding such as 8 bit/10 bit coding scheme is used to force the written data to be DC balanced before storing. Alternatively, a 64 bit/67 bit coding scheme as described in the Interlaken Data Protocol. (See Interlaken Data Protocol) can also be used to identify the optimal or best Vt under the current condition.

After setting X to the beginning of Vt range ("Vt(x)") and setting Y to the end of Vt range ("Vt(y)") at steps 702-704, the data page is read using the existing Vt or Vt(x) at step 706. After recording the BER(x) of the data page, the data page is read again using the Vt(y) and a BER(y) is calculated at step 708. Note that BER is generated based on detecting unbalanced data, which can be a page or a portion of page, based on DC balance code. If the BER or DC unbalance is not minimized, repeat step 706-710 until a minimum BER or DC balance is found. Once the optimal Vt is found, it is subsequently used to reference the data from the other page. It should be noted that derivation of optimal Vt can be set as a start value for the other pages in the same block or FMB.

Figure 8:
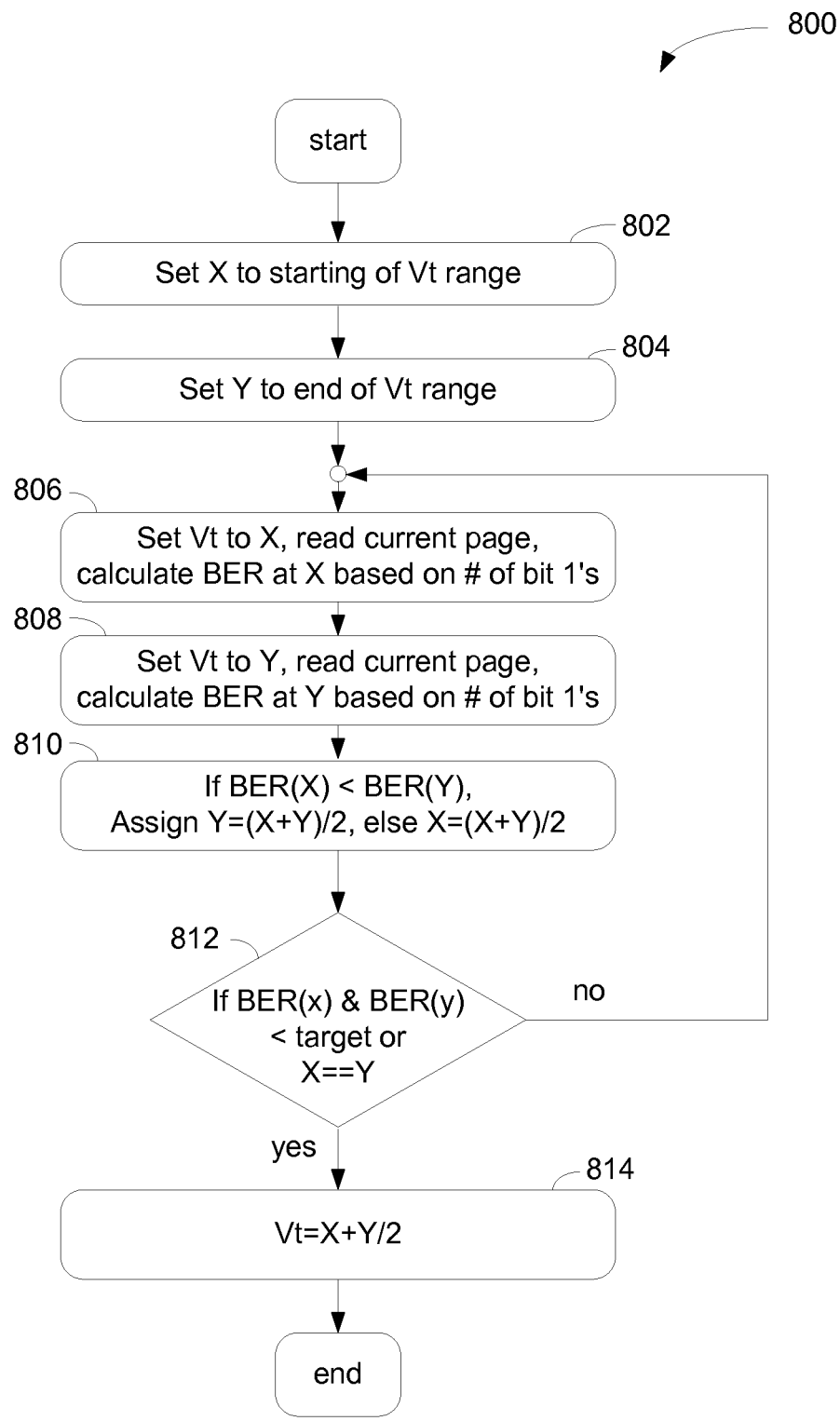
FIG. 8 is a flowchart illustrating a process of identifying an optimal Vt using a counter capable of counting the number of 1's and/or 0's in accordance with one embodiment of the present invention.

FIG. 8 is a flowchart illustrating a process of identifying an optimal Vt using a counter capable of counting the number of 1's in accordance with one embodiment of the present invention. To operate a counting method, a counter is used to count the number of 1's in the read result as a binary value page. The number of 1's is counted and subsequently recorded in data page's metadata. In one aspect, the recorded counted value is subsequently used to compare with number of 1's read from the data recently obtained or read.

Upon setting X to the beginning of Vt range ("Vt(x)") and setting Y to the end of Vt range ("Vt(y)") at steps 802-804, the data page is read using the existing Vt or Vt(x) at step 806. After recording the BER(x) of the data page, the data page is read again using the Vt(y) and a BER(y) is calculated at step 808. Note that BER is generated based on identifying the difference of the actual number of 1's versus the recorded number of 1's in the meta data assuming that the ECC decoding is used to provide the correct stats count of 1's in the meta data. If the difference value of the number of 1's is not minimized, steps 806-810 are repeated until a minimum difference of the number of 1's is reached. Once the optimum Vt is found, it will be used for the rest of reading in the FMB. In addition, the optimal Vt is also stored as a future reference value or new Vt starting point.

Figure 9:
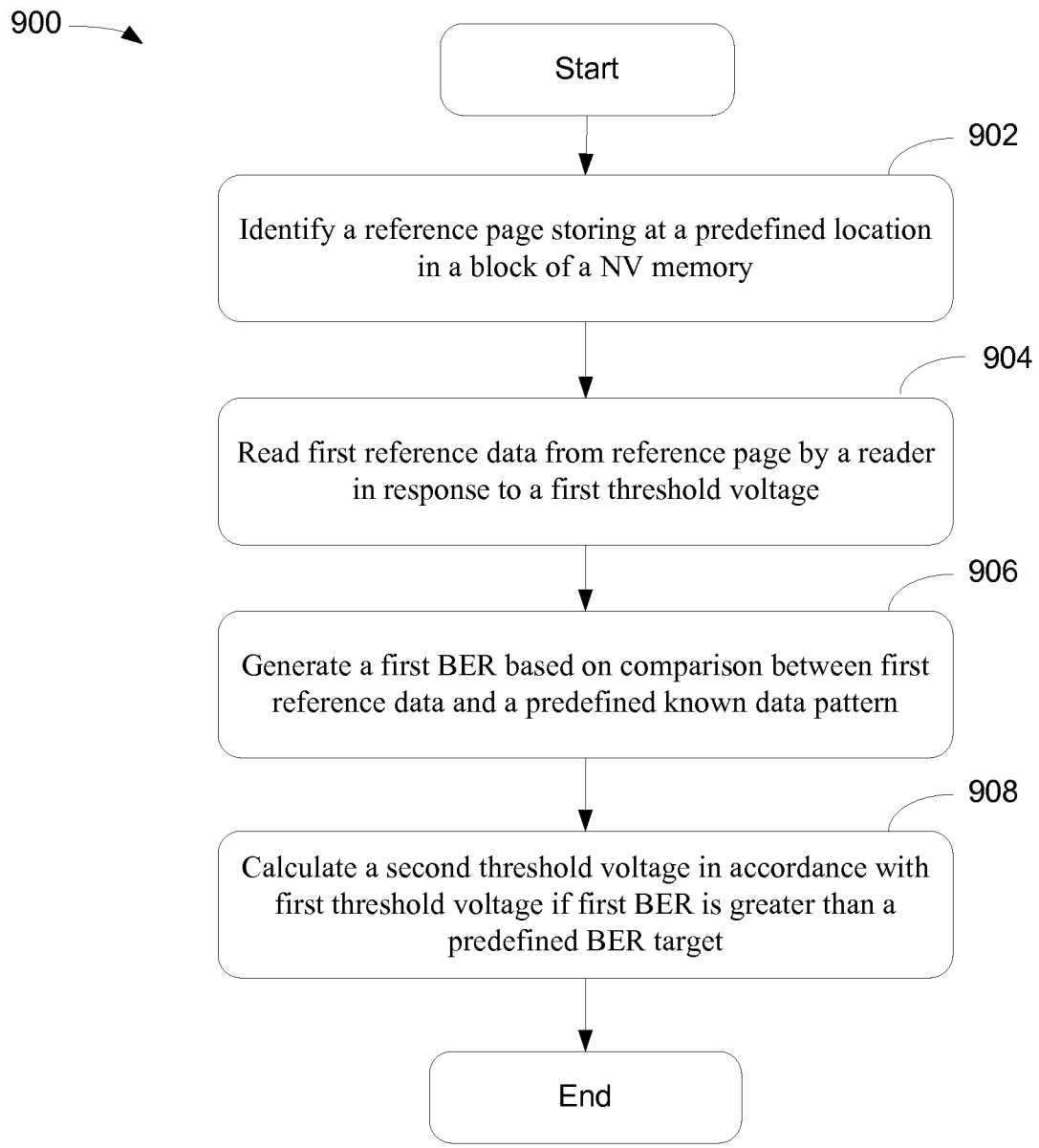
FIG. 9 is a flow diagram illustrating an operation of VtR using a reference page in accordance with one embodiment of the present invention.

FIG. 9 is a flow diagram 900 illustrating an operation of VtR using a reference page in accordance with one embodiment of the present invention. At block 902, upon receiving a memory access command such as memory read, a reference page storing at a predefined location in a block of a NV memory is identified. In one example, the reference page containing a checkerboard data pattern is identified in a flash memory based SSD.

At block 904, after reading the first reference data from the reference page by a reader in response to a first Vt, a first BER is generated at block 906 based on the comparison between the first reference data and the predefined known data pattern, such as a checkerboard pattern.

At block 908, if the first BER is greater than the predefined BER target, a second Vt is calculated in accordance with the first Vt. In one aspect, after reading second reference data from the reference page by the reader in response to the second Vt, a second BER is generated based on the comparison between the second reference data and the predefined known data pattern. If the second BER is still greater than the predefined BER target, a third Vt may be calculated in accordance with the second Vt. If, however, the second BER is equal to or less than the predefined BER target, the reference Vt or optimal Vt is set to the second Vt. In one embodiment, the reference page containing a checkerboard data pattern is stored at the predefined location in the block or FMB of the storage device. It should be noted that a new Vt can be determined based on a predefined midpoint voltage incremental process or binary search mechanism.

It should be noted that recalibrating Vt may be scheduled to run at the background. One advantage of calibrating the Vt value during background running is that it reduces potential performance impact to normal read and/or write operations. In one embodiment, the mechanisms of reference page, DC balanced approach, and counting the number of 1's can be combined to maximize performance efficiency. For example, a reference page containing checkerboard pattern can be written to a predefined fixed page of erasable block. The DC balanced coding can be subsequently applied for the data pattern written into the flash memory page. At the same time, a counter may be used to count the number of 1's in the data pattern.

Figure 10:
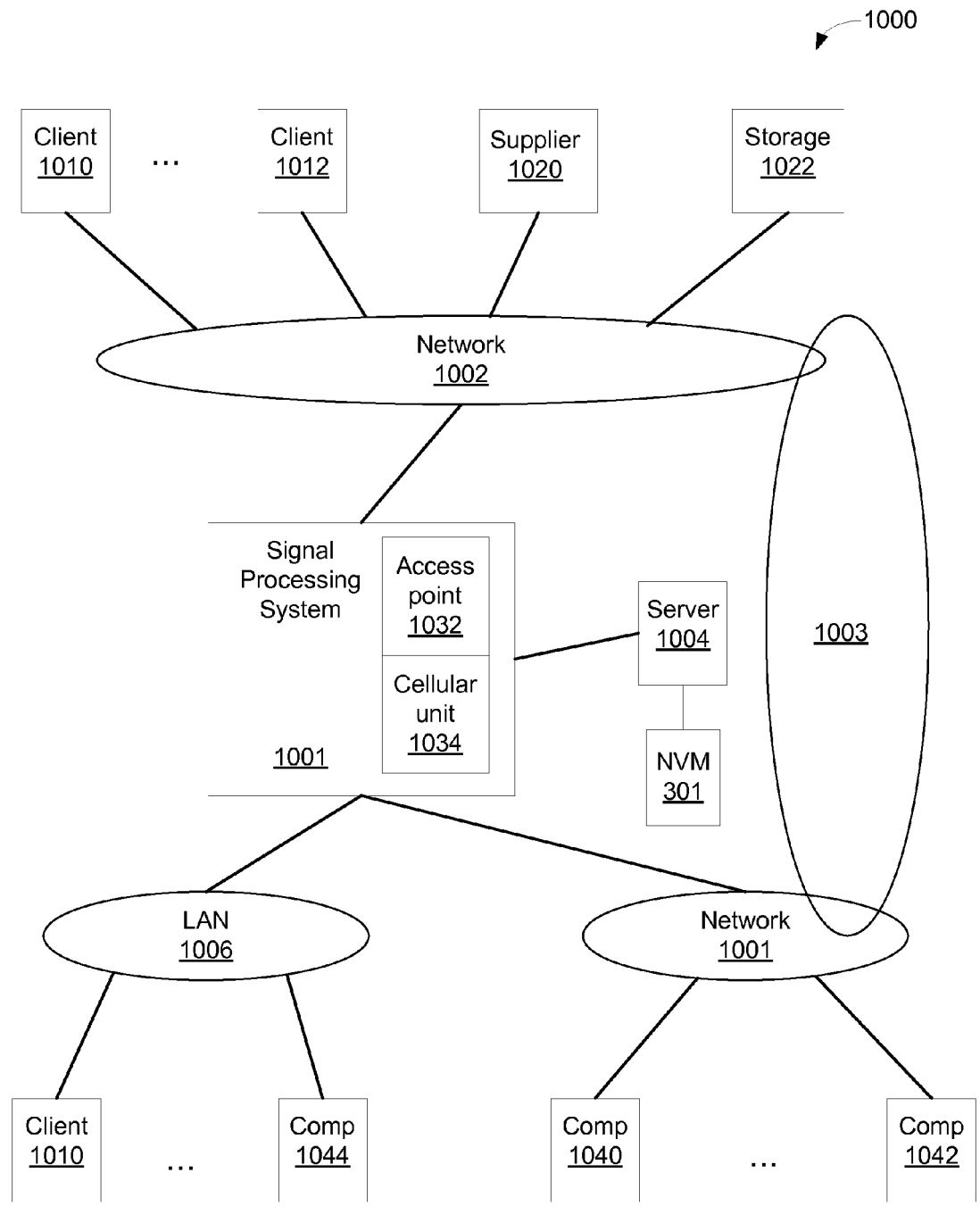
FIG. 10 is a diagram illustrating a computer network capable of providing network traffic routing between various users using a storage device capable of recalibrating Vt in accordance with one embodiment of the present invention.

FIG. 10 is a diagram illustrating a computer network 1000 capable of providing network traffic routing between various users using a storage device capable of recalibrating Vt in accordance with one embodiment of the present invention. In this network environment, a system 1001 is coupled to a wide-area network 1002, LAN 1006, Network 1001, and server 1004. Wide-area network 1002 includes the Internet, or other proprietary networks including America On-Line™, SBC™, Microsoft Network™, and Prodigy™. Wide-area network 1002 may further include network backbones, longhaul telephone lines, Internet service providers, various levels of network routers, and other means for routing data between computers.

Server 1004 is coupled to wide-area network 1002 and is, in one aspect, used to route data to clients 1010-1012 through a local-area network ("LAN") 1006. Server 1004 is coupled to SSD 500 wherein server 1004 can be configured to improve data integrity using Vt recalibration to compensate the loss of charge. The LAN connection allows client systems 1010-1012 to communicate with each other through LAN 1006. Using conventional network protocols, USB portable system 1030 may communicate through wide-area network 1002 to client computer systems 1010-1012, supplier system 1020 and storage device 1022. For example, client system 1010 is connected directly to wide-area network 1002 through direct or dial-up telephone or other network transmission lines. Alternatively, clients 1010-1012 may be connected through wide-area network 1002 using a modem pool.

Figure 11:
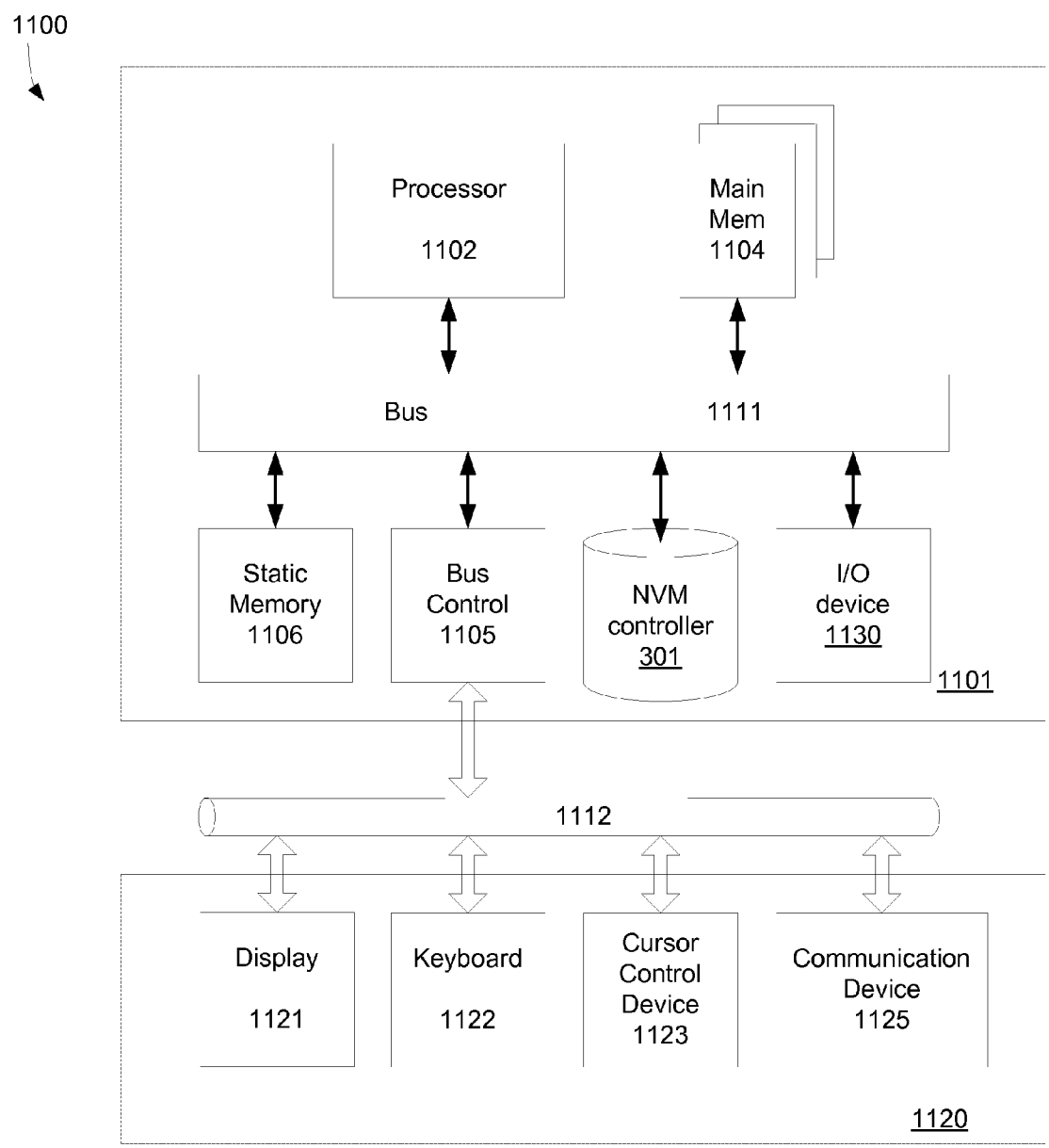
FIG. 11 is a block diagram illustrating a digital processing system capable of providing Vt recalibration for a data storage device in accordance with one embodiment of the present invention.

Having briefly described one embodiment of the computer network in which the embodiment(s) of the present invention operates, FIG. 11 illustrates an example of a computer system 1100, which can be a server, a router, a switch, a node, a hub, a wireless device, or a computer system.

FIG. 11 is a block diagram illustrating a digital processing system 1100 capable of providing Vt recalibration for a data storage device in accordance with one embodiment of the present invention. Computer system or a signal separation system 1100 can include a processing unit 1101, an interface bus 1111, and an input/output ("IO") unit 1120. Processing unit 1101 includes a processor 1102, a main memory 1104, a system bus 1111, a static memory device 1106, a bus control unit 1105, an I/O element 1130, and a NVM controller 301. It should be noted that the underlying concept of the exemplary embodiment(s) of the present invention would not change if one or more blocks (circuit or elements) were added to or removed from FIG. 11.

Bus 1111 is used to transmit information between various components and processor 1102 for data processing. Processor 1102 may be any of a wide variety of general-purpose processors, embedded processors, or microprocessors such as ARM® embedded processors, Intel® Core™ Duo, Core™ Quad, Xeon®, Pentium microprocessor, Motorola™ 68040, AMD® family processors, or Power PC™ microprocessor.

Main memory 1104, which may include multiple levels of cache memories, stores frequently used data and instructions. Main memory 1104 may be RAM (random access memory), MRAM (magnetic RAM), or flash memory. Static memory 1106 may be a ROM (read-only memory), which is coupled to bus 1111, for storing static information and/or instructions. Bus control unit 1105 is coupled to buses 1111-1112 and controls which component, such as main memory 1104 or processor 1102, can use the bus. Bus control unit 1105 manages the communications between bus 1111 and bus 1112. Mass storage memory or SSD 106, which may be a magnetic disk, an optical disk, hard disk drive, floppy disk, CD-ROM, and/or flash memories are used for storing large amounts of data.

I/O unit 1120, in one embodiment, includes a display 1121, keyboard 1122, cursor control device 1123, and communication device 1125. Display device 1121 may be a liquid crystal device, cathode ray tube ("CRT"), touch-screen display, or other suitable display device. Display 1121 projects or displays images of a graphical planning board. Keyboard 1122 may be a conventional alphanumeric input device for communicating information between computer system 1100 and computer operator(s). Another type of user input device is cursor control device 1123, such as a conventional mouse, touch mouse, trackball, or other type of cursor for communicating information between system 1100 and user(s).

Communication device 1125 is coupled to bus 1111 for accessing information from remote computers or servers, such as server 104 or other computers, through wide-area network 102. Communication device 1125 may include a modem or a network interface device, or other similar devices that facilitate communication between computer 1100 and the network. Computer system 1100 may be coupled to a number of servers 104 via a network infrastructure such as the infrastructure illustrated in FIG. 11.

While particular embodiments of the present invention have been shown and described, it will be obvious to those skilled in the art that, based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method able to recalibrate threshold voltage, comprising:
   identifying a reference page storing at a predefined location in a block of a non-volatile ("NV") memory after receiving a read command;
   reading first reference data from the reference page by a reader in response to a first threshold voltage;
   generating a first bit error rate ("BER") based on comparison between the first reference data and a predefined known data pattern;
   calculating a second threshold voltage in accordance with the first threshold voltage if the first BER is greater than a predefined BER target; and
   setting reference threshold voltage to the second threshold voltage when the second BER is less than the predefined BER target.

2. The method of claim 1, further comprising:
   reading second reference data from the reference page by the reader in response to the second threshold voltage; and
   generating a second BER based on comparison between the second reference data and the predefined known data pattern.

3. The method of claim 2, further comprising calculating a third threshold voltage in accordance with the second threshold voltage if the second BER is greater than the predefined BER target.

4. The method of claim 2, further comprising setting reference threshold voltage to the second threshold voltage when the second BER is equal to the predefined BER target.

5. The method of claim 2, further comprising setting reference threshold voltage to the second threshold voltage when the second BER is less than the predefined BER target.

6. The method of claim 1, further comprising storing the reference page containing a checkerboard data pattern at the predefined location in the block of the NV memory after receiving a command to write the block.

7. The method of claim 1, wherein identifying the reference page storing at the predefined location in the block of the NV memory includes identifying a first reference page containing checkerboard data pattern from a flash memory based solid state drive ("SSD").

8. The method of claim 1, wherein the calculating a second threshold voltage in accordance with the first threshold voltage includes determining a new threshold voltage based on a predefined midpoint voltage incremental process.

9. A method for modifying threshold voltage, comprising:
identifying a data page in a block of a non-volatile ("NV") memory after receiving a command to read the block;
reading a first predefined set of data from the data page by a reader in response to a first threshold voltage;
generating a first bit error rate ("BER") based on a predefined direct-current ("DC") balance coding scheme;
calculating a second threshold voltage in accordance with the first threshold voltage if the first BER is greater than a predefined BER target;
reading a second predefined set of data from the data page by the reader in response to the second threshold voltage; and
generating a second BER based on the predefined DC balance coding scheme.

10. The method of claim 9, further comprising calculating a third threshold voltage in accordance with the second threshold voltage if the second BER is greater than the predefined BER target.

11. The method of claim 9, further comprising setting reference threshold voltage to the second threshold voltage when the second BER is equal to the predefined BER target.

12. The method of claim 9, further comprising setting reference threshold voltage to the second threshold voltage when the second BER is less than the predefined BER target.

13. The method of claim 9, wherein generating a first BER based on a predefined DC balance coding scheme includes counting one's (1's) and zero's (0's) in the first predefined set of data formatted in a eight(8) bits/ten (10) bits DC balance coding scheme.

14. A method configured to optimize threshold voltage, comprising:
identifying a data page in a block of a non-volatile ("NV") memory after receiving a command to read the data page;
reading a first data from the data page by a reader in response to a first threshold voltage and counting number of one's (1's) within the first data ;
fetching a counting metadata associated with the data page from the block and identifying an original count from the counting metadata;
generating a first bit error rate ("BER") based on comparison between the number of 1's in the first data and the original count; and
calculating a second threshold voltage in accordance with the first threshold voltage if the first BER is greater than a predefined BER target.

15. The method of claim 14, further comprising:
reading a second data from the data page by the reader in response to the second threshold voltage;
counting number of one's (1's) within the second data; and
generating a second BER based on comparison between the number of 1's in the second data and the original count.

16. The method of claim 15, further comprising calculating a third threshold voltage in accordance with the second threshold voltage if the second BER is greater than the predefined BER target.

17. The method of claim 15, further comprising setting reference threshold voltage to the second threshold voltage when the second BER is equal to the predefined BER target.

18. The method of claim 15, further comprising setting reference threshold voltage to the second threshold voltage when the second BER is less than the predefined BER target.

* * * * *